United States Patent [19]
Ehrler

[11] Patent Number: 6,038,384
[45] Date of Patent: Mar. 14, 2000

[54] INPUT SLOPE TIMING ANALYSIS AND NON-LINEAR DELAY TABLE OPTIMIZATION

[75] Inventor: Timothy J. Ehrler, Phoenix, Ariz.

[73] Assignee: VLSI Technology, Inc., San Jose, Calif.

[21] Appl. No.: 08/989,833

[22] Filed: Dec. 12, 1997

[51] Int. Cl.[7] .................................................. G06F 17/50
[52] U.S. Cl. ................................ 395/500.07; 395/500.06
[58] Field of Search ........................ 395/500.05, 500.06, 395/500.07, 500.11

[56] References Cited

U.S. PATENT DOCUMENTS

| | | | |
|---|---|---|---|
| 5,568,395 | 10/1996 | Huang | 395/500.05 |
| 5,617,325 | 4/1997 | Schaefer | 364/488 |
| 5,903,468 | 5/1999 | Misheloff et al. | 395/500.07 |

OTHER PUBLICATIONS

Karnik and Kang "An Empirical Model for Accurate Estimation of Routing DElay in FPGAs," 1995 IEEE/ACM International Conference on Computer–Aided Design, Nov. 5–9, 1995, pp.328–331.

Chung et al. "Advanced Delay Analysis Method for Submicron ASIC Technology," Proceedings of the Fifth Annual IEEE International ASIC Conference and Exhibit, Sep. 21–25, 1992, pp.471–474.

Edamatsu et al. "Pre–layout calculation specification for CMOS ASIC Libraries," Proceedings of the ASP–DAC '98. Asia and South Pacific Design Automation Conference, Feb. 10–13, 1998, pp.241–248.

Kahng et al. "Analytical Delay Models for VLSI Interconnects Under Ramo Input," 1996 IEEE/ACM International Conference on Computer–Aided Design, Nov. 10–14, 1996, pp.30–36.

Friedman and Mulligan "Ramp Input Response of RC Tree Networks," Ninth Annual IEEE International ASIC Conference and Exhibit, Sep. 23–27, 1996, pp.63–66.

CAD Software Development Group, ASIC Core Technology, VLSI Technology, Inc., "Input Slope Models & Synopsys Non–Linear Delay Table Analysis", Sep. 15, 1994, version 1.2.

*Primary Examiner*—Kevin J. Teska
*Assistant Examiner*—Leigh Marie Garbowski
*Attorney, Agent, or Firm*—Wagner, Murabito & Hao

[57] ABSTRACT

The optimization process of the present invention replaces the successive delay table generation approach of the prior art with one that minimizes delay table size by generating only those indices sufficient to satisfy the error limits prescribed. This is accomplished by generating only portions of the delay table by reducing the maximum load/ramp point for each generated portion until such time as the error percentage limit is not exceeded. The load/ramp indices for the generated delay tables are those defined for the interpolation comparison table. These non-linearly distributed indices force a greater indexing range within the higher load/ramp regions, where relative interpolation error percentage are not as great as those within the lower regions. Within the present invention, the maximum load/ramp point of the last optimized portion becomes the minimum of the next portion, while the maximum load/ramp of the interpolation table becomes the next max point. Once all portions have been generated, the load and ramp indices for the optimized table will have been completely defined. This process ensures that only the minimum number of indices sufficient to satisfy the error percentage limit along the critical input ramp are generated.

19 Claims, 10 Drawing Sheets

INPUT SLOPE TIMING ANALYSIS AND NON-LINEAR DELAY TABLE OPTIMIZATION

TECHNICAL FIELD

The present invention relates to the field of computer implemented modeling of integrated circuit devices. More specifically, the present invention relates to the field of propagation delay modeling for an integrated circuit design.

BACKGROUND ART

Integrated circuits (ICs) can be designed from high level description (HDL) languages which describe behavior, and connectivity, between elements of the IC device. In the process of simulating the behavior of integrated circuits represented as netlists, it is often necessary to provide libraries of data structures which characterize a particular IC block. One such library is a delay table which characterizes the propagation delay of a signal from an input to an output of the IC block. Each propagation delay is based on a particular ramp input of the input signal at the block's input and a particular capacitance value loaded on the block's output.

A prior art implementation of such a delay table is described in a reference entitled "Input Slope Models & Synopsys Non-Linear Delay Table Analysis," (Version 1.2) by Timothy J. Ehrler, provided herewith. In which a 25×25 table of delay values is provided indexed by "output loading" ranging from 0.0 to 9.6 picofarads (pfs) and "input ramp" ranging from 0.0 to 4.8 nanosecons (ns). The table covers most load and ramp ranges of all timing relationships (rels), while at the same time including all relevant critical input ramp (CIR) points. Although this table and its associated indices have been determined to be sufficient to cover most timing relationships within a particular analyzed library, it is applicable only to those rels within those cells within that library, and it is not applicable to any other library.

Moreover, this table is also very costly in terms of resource usage, given that there are over 300 single stage rels within the sample library. One example rel requires only a 3×23 array within the 25×25 one, resulting in an 89 percent waste of table resources for this particular rel. Note also that the table area bounding the CIR is essentially broken up into 4 regions. This is due to the fact that fast and slow ramp areas are represented as planes which intersect at CIR, the load and ramp indices of which intersect CIR. The predetermined table is thus divided into four regions, two of which contain CIR.

A prior art implementation of a single-stage ISM (input slope model) delay model within a Synopsys NLD library specified a 25×25 table of delay values, linearly indexed by "output loading" (total_output_net_capacitance) and "input ramp" (input_net_transition). This table covered most load and ramp ranges of all timing relationships (rels), while at the same time including all relevant critical input ramp (CIR) points. The inclusion of CIR points is critical to the delay table, since they define the "line" where the fast-ramp delay region's "plane" intersects the "slow ramp" delay region's "plane". As such, it also defines the regions for within which interpolation errors are the greatest.

As documented in the above referenced optimization specification, Input Slope Models & Synopsys Non-Linear Delay Table Analysis, the interpolation errors were most severe within the lowest load region. In order to reduce these errors, the table's sample points were forced to be closer together within this region. By using a non-linear distribution of table indices, these low load region errors were reduced, at the expense of only very slightly increasing interpolation errors in the highest load regions.

The prior art optimization process first determined the maximum capacitance the output pin is capable of driving, using is as the upper load limit with 0.0 being the lower. An interpolation delay table was then generated for 64 non-linearly indexed load points between 0.0 and the maximum capacitance, inclusive, with the ramp indices calculated as the critical input ramp values corresponding to the given load points. Delay tables were then generated in a similar manner, sequentially increasing the number of non-linearly indexed load points from 2 through 64 as required.

Since interpolation errors are the greatest along the critical input ramp, delay values interpolated along the CIR of the generated table were compared with those in the interpolation delay table, the latter's load and ramp indices being used as interpolation indices into the generated delay table. Delay table generation continued unit such time as the maximum absolute percentage of error from the calculated delay values along the CIR is not greater than 5%.

FIG. 1 outlines the described prior art optimization methodology 200. FIG. 2 shows the optimized 18×18 geometrically indexed delay table 205 for the example timing rel, illustrating the concentration of load/ramp indices within the lower load regions. Also shown is the 64×64 non-linearly indexed base array 230 over which interpolation error analysis to within 5% is performed. The smaller closely spaced grid lines 210 represent the interpolation delay table. The farther apart darker grid lines 220 represent the optimized delay table and the diagonal line 225 running through the outer represents the critical input ramp function.

FIG. 3 illustrates the interpolation errors for the optimized delay table with respect to the base array, the maximum absolute value of which is 4.61%. Note the higher absolute interpolated delay error percentage within the lower load and ramp regions as compared to those of the higher ones. In FIG. 3, the closely spaced grid 250 represents the optimized table interpolation error and the bottom running line 240 represents the critical input ramp interpolation error.

The prior art optimization specification employed a continuous non-linear distribution of table indices, successively generating ever larger delay tables until such time as the maximum error percentage along the critical input ramp was within 5%, or the generated table size was that of the interpolation comparison one. While this guaranteed that interpolated delay values within the optimized tables were within the maximum error percentage limit, it also resulted in the generation of tables much larger than necessary to satisfy error limit requirements in the upper load/ramp region, as can be seen in FIG. 3.

Accordingly, what is needed is a table is provides sufficient coverage while not consuming too much memory. What is needed further is a delay table that can be individually tailored to contain only enough points to include the CIR over the net's output load capacitance range. The present invention provides such a solution.

DISCLOSURE OF THE INVENTION

The present invention provides an analysis of input slope timing characterizations for single-stage timing relationships, generating optimal non-linear delay tables of sufficient size and granularity that interpolated delay values satisfy specified error limits. The present invention significantly reduces optimized delay table sizes over the prior art methodology thereby requiring much less memory resources, while satisfying interpolation error percentage limits. The greatly improves design synthesis library compilation and search time while still providing sufficiently accurate timing estimates.

The optimization process of the present invention replaces the successive delay table generation approach of the prior art with one that minimizes delay table size by generating only those indices sufficient to satisfy the error limits prescribed. This is accomplished by generating only portions of the delay table by reducing the maximum load/ramp point for each generated portion until such time as the error percentage limit is not exceeded. The load/ramp indices for the generated delay tables are those defined for the interpolation comparison table. These non-linearly distributed indices force a greater indexing range within the higher load/ramp regions, where relative interpolation error percentage are not as great as those within the lower regions. Within the present invention, the maximum load/ramp point of the last optimized portion becomes the minimum of the next portion, while the maximum load/ramp of the interpolation table becomes the next max point. Once all portions have been generated, the load and ramp indices for the optimized table will have been completely defined. This process ensures that only the minimum number of indices sufficient to satisfy the error percentage limit along the critical input ramp are generated.

An embodiment of the present invention includes a method of determining a delay table for characterizing signal propagation delay of an integrated circuit block, the method comprising the steps of: a) receiving an N×N interpolation table having N ramp input indices and N output capacitance indices and an actual delay value at each intersection of the indices, the interpolation table characterizing the signal propagation delay and receiving a maximum capacitance; b) generating a first M×M delay table having M ramp input indices and M output capacitance indices which range from a minimum output capacitance to a maximum output capacitance; c) interpolating over bounds of the delay table to generate interpolated delay values; d) comparing the interpolated delay values with corresponding actual delay values of the interpolation table; e) reducing the maximum output capacitance range of the delay table and repeating steps c)–e) provided any of the interpolated delay values exceed a predetermined error percentage; and f) generating a second M×M delay table and repeating steps c)–e) on the second delay table provided the interpolated delay values of the first delay table do not exceed a predetermined error percentage. Embodiments include the above and further comprising the step of combining the first and second delay tables for characterizing the signal propagation delay of the integrated circuit block.

BEST MODE FOR CARRYING OUT THE INVENTION

Figure 1:
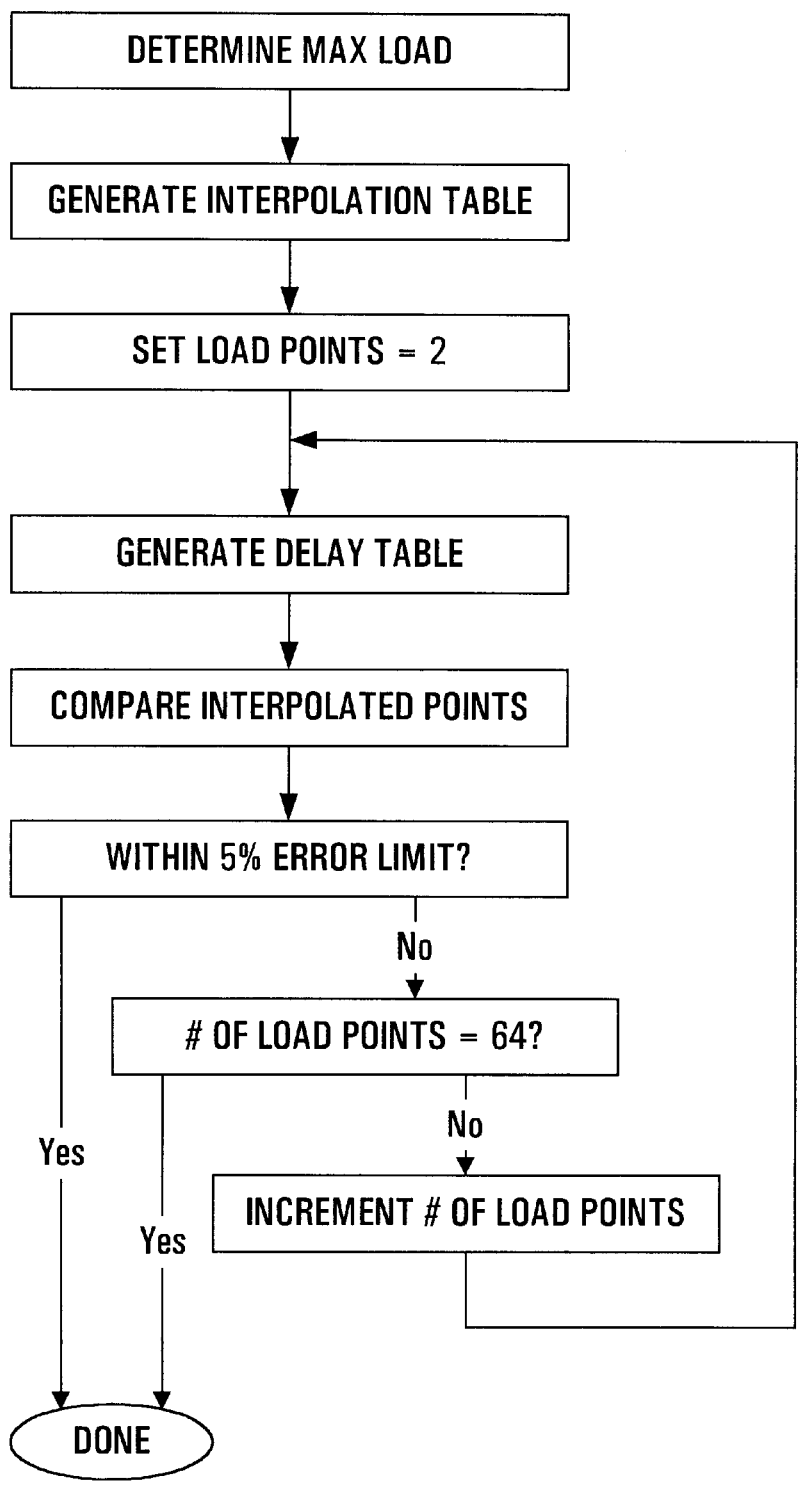
FIG. 1 illustrates a prior art optimization methodology.
Figure 2:
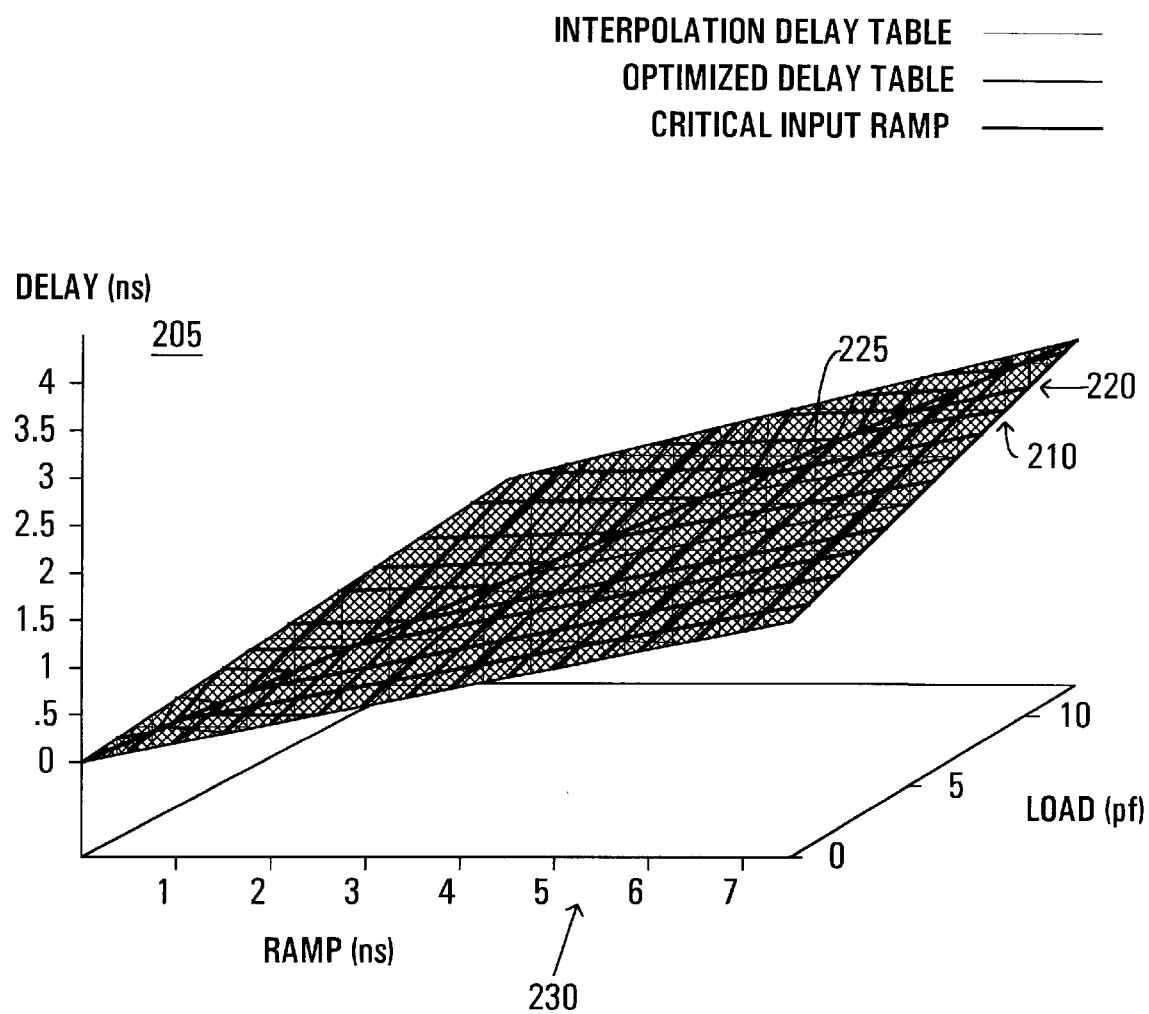
FIG. 2 shows an optimized 18×18 geometrically indexed delay table for an example timing rel and illustrates the concentration of load/ramp indices within the lower load regions.
Figure 3:
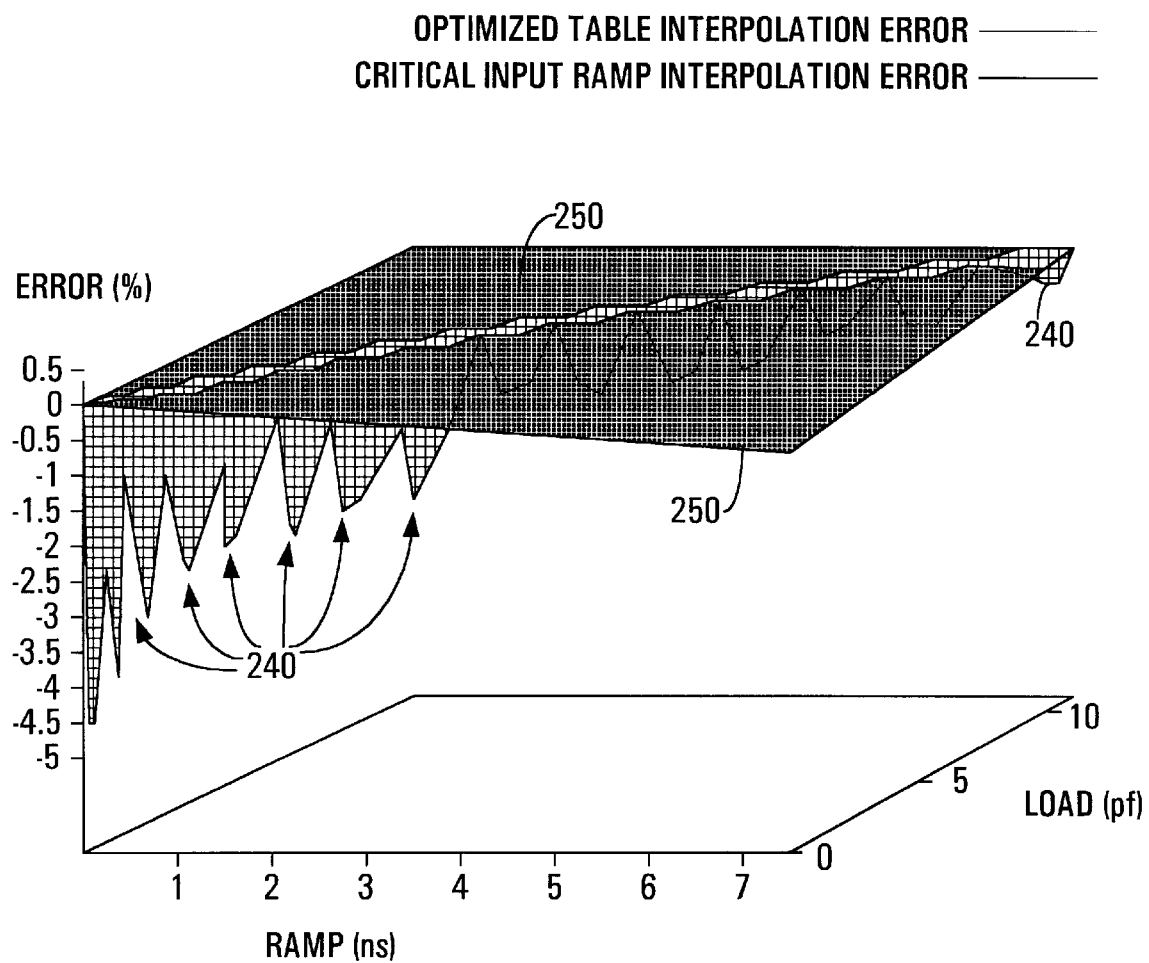
FIG. 3 illustrates the interpolation errors for the optimized delay table with respect to the base array.

In the following detailed description of the present invention, an improved input slope timing analysis process and non-linear delay table optimization process numerous specific details are set forth in order to provide a thorough understanding of the present invention. However, it will be obvious to one skilled in the art that the present invention may be practiced without these specific details or by using alternate elements or methods. In other instances well known methods, procedures, components, and circuits have not been described in detail as not to unnecessarily obscure aspects of the present invention.

Notation and Nomenclature

Some portions of the detailed descriptions which follow are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "computing" or "translating" or "calculating" or "determining" or "displaying" or "recognizing" or the like, refer to the action and processes of a computer system (e.g., FIG. 4), or similar electronic computing device, that manipulates and transforms data represented as physical (electronic) quantities within the computer system's registers and memories into other data similarly represented as physical quantities within the computer system memories or registers or other such information storage, transmission or display devices.

Computer System Platform 112

Aspects of the present invention, described below, are discussed in terms of steps executed on a computer system (e.g., process 500). Although a variety of different computer systems can be used with the present invention, an exemplary general purpose computer system 112 is shown in FIG. 4.

In general, computer system 112 includes an address/data bus 100 for communicating information, a central processor 101 coupled with the bus for processing information and instructions, a volatile memory 102 (e.g., random access memory RAM) coupled with the bus 100 for storing information and instructions for the central processor 101 and a non-volatile memory 103 (e.g., read only memory ROM) coupled with the bus 100 for storing static information and instructions for the processor 101. Computer system 112 also includes a data storage device 104 ("disk subsystem") such as a magnetic or optical disk and disk drive coupled with the bus 100 for storing information and instructions and a display device 105 coupled to the bus 100 for displaying information to the computer user. Data storage device 104 can include one or more removable magnetic or optical storage medias (e.g., diskettes, tapes) which are computer readable memories.

Figure 4:
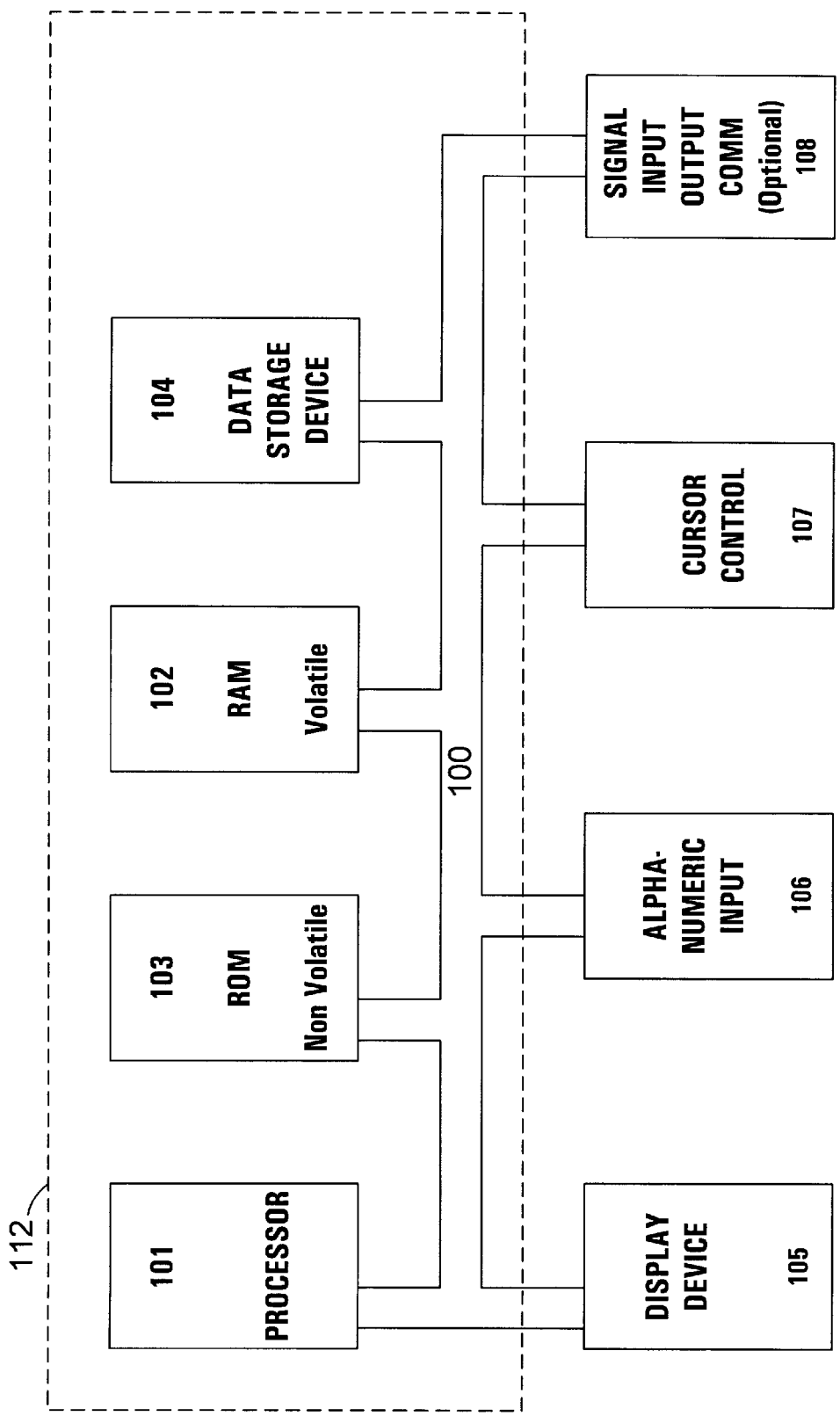
FIG. 4 illustrates a general purpose computer system on which embodiments of the present invention can be implemented.

Also included in computer system 112 of FIG. 4 is an alphanumeric input device 106 including alphanumeric and function keys coupled to the bus 100 for communicating information and command selections to the central processor 101. System 112 also includes a cursor control or directing device 107 coupled to the bus for communicating user input information and command selections to the central processor 101. Computer system 112 can also include an optional signal generating device 108 coupled to the bus 100 for interfacing with other networked computer systems. The display device 105 utilized with the computer system 112 of the present invention may be a liquid crystal device, other flat panel display, cathode ray tube, or other display device suitable for creating graphic images and alphanumeric characters recognizable to the user.

The present invention optimization process replaces the successive delay table generation approach with one that minimizes delay table size by generating only those indices sufficient to satisfy the error limits. This is accomplished by generating only portions of the delay table by reducing the maximum load/ramp point for each generated portion until such time as the error percentage limit is not exceeded.

The load/ramp indices for the generated tables are those defined for the interpolation comparison table. These nonlinearly distributed indices force a greater indexing range within the higher load/ramp regions, where relative interpolation error percentages are not as great as those within the lower regions. The maximum load/ramp point of the last optimized portion becomes the minimum of the next, while the maximum load/ramp of the interpolation table becomes the next max point.

Once all portions have been generated, the load and ramp indices for the optimized table will have been completely defined. The present invention ensures that only the minimum number of indices sufficient to satisfy the error percentage limit along the critical input ramp are generated.

Figure 5:
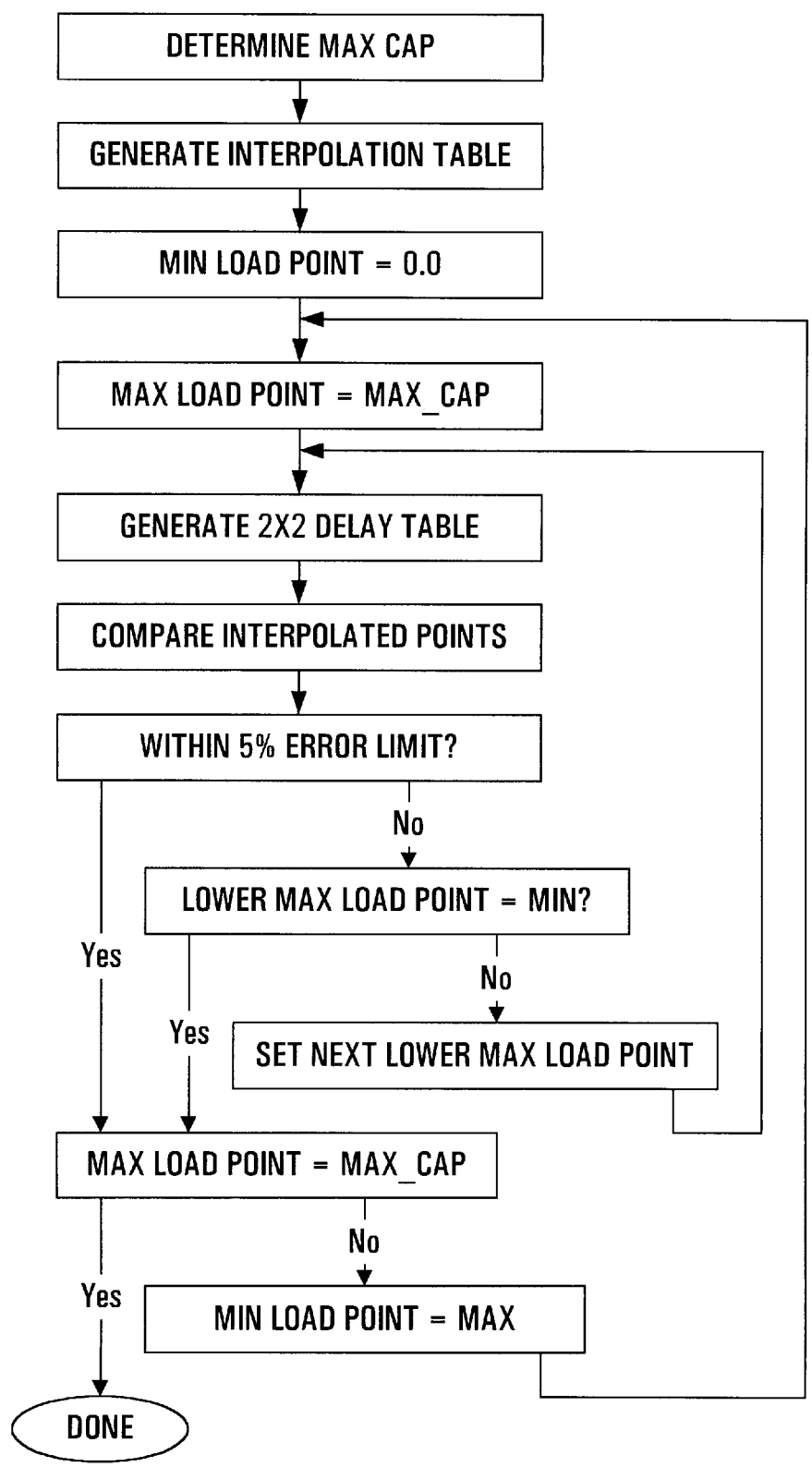
FIG. 5 outlines the optimization methodology of the present invention.

FIG. 5 outlines one embodiment of the described optimization process 410 of the present invention.

Operation of Improved Optimization Process

Figure 6:
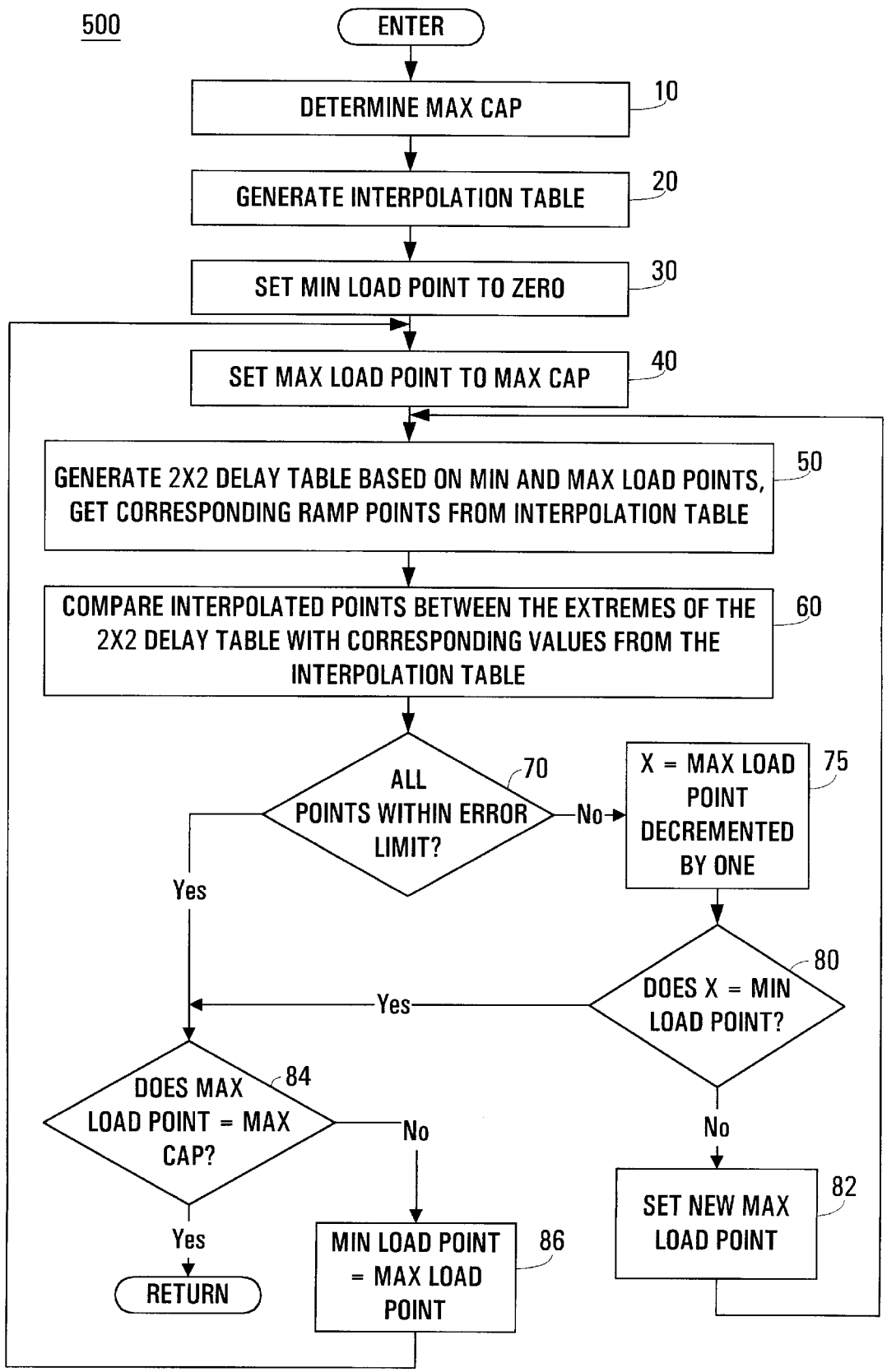
FIG. 6 illustrates steps within the delay table optimization process of the present invention.

FIG. 6 illustrates a flow chart of a more general process 500 of the present invention for generating an optimized delay table. Process 500 is implemented, in one embodiment, as instruction code stored within computer readable memory units of computer system 112 and executed by processor 101. Process 500 generates an optimized delay table for a given error tolerance value for a particular integrated circuit block. The optimized delay table is used in the calculation of estimated propagation delays through the integrated circuit block given a particular input ramp and a particular output capacitance loaded on the relevant output of the integrated circuit block. Well known interpolation processes are used in this process.

Process 500 commences at step 10 where the maximum load or maximum capacitance is determined. This is the maximum capacitance expected to be loaded on the given integrated circuit block output. This is value can be given as an input to process 500 or it can be determined using one of a variety of well known processes. At step 20, the present invention either generates or receives an existing interpolation table having an "actual" delay value associated with each ramp input—output load capacitance pair. A number of well known techniques can be used to implement step 20. In one embodiment of the present invention, the interpolation table is an N×N table (e.g.,. in one embodiment N=64) with N references of ramp input values and N references of output load capacitances. At each ramp input—load capacitance intersection, a delay value is given for the propagation delay of the integrated circuit block under the appropriate input and loading conditions. Step 20 can be implemented using the teachings of the reference entitled "Input Slope Models and Synopsys Non-Linear Delay Table Analysis" (Version 1.2) by Timothy J. Ehrler, dated Sep. 15, 1995 and enclosed herewith. The interpolation table is stored in computer readable memory units of computer system 112.

At step 20, a ramp value is associated with each reference load capacitance value. The ramp value is determined based on a relationship describing the critical input ramp and a number of well known mechanisms for determining the ramp values associated with each reference load capacitance value can be used.

At step 30 of FIG. 6, a value called the minimum (min) load point is set to zero as an initialization step. At step 40, the maximum (max) load point is set to the maximum capacitance value as determined by step 10. At step 50, the present invention then generates a 2×2 delay table based on the minimum load point and the maximum load point described above. The ramp input values corresponding to the minimum load point and the maximum load point are obtained from the interpolation table and originate from the critical input ramp relationship as described above.

At step 60, the present invention determines the load capacitance reference points (from the interpolation table) existing between the minimum load point and the maximum load point for the 2×2 delay table, obtains the corresponding ramp input values for these load capacitance reference points and, for each, uses the 2×2 delay table to interpolate a delay value for each intersection. A number of well known methods can be used to perform this interpolation step. The delay values (called "interpolated" delay values) that are computed by step 60 are then stored in computer readable memory units of computer system 112. At step 60, the present invention then compares the interpolated delay values computed at step 60 against the actual delay values present within the interpolation table that was generated at step 20.

At step 70, if all of the interpolated delay values are within a predetermined error tolerance (e.g., 5 percent in one embodiment) of the actual delay values of the interpolation table, then step 84 is entered, otherwise, step 75 is entered. At step 75, the present invention computes a value, x, that is equal to the max load point decremented by one and, at step 80, the present invention compares x (the decremented max load point) to the min load point. If they are equal, then step 84 is entered. If they are not equal, then a new max load point is set at step 82 (e.g., the max load point is set to the value of x). At this point, a new 2×2 delay table is defined having new boundaries and step 50 is entered again to compute interpolated delay values corresponding to this new 2×2 delay table. The new 2×2 delay table is equal to the previously 2×2 delay table with a smaller maximum boundary. This sub-process continues until a 2×2 delay table of appropriate upper bound is found that satisfies step 70 (e.g., generates interpolated delay values within the prescribed tolerance value of the actual delay values). Generally, the present invention utilizes the above steps to pull back on the upper bound of the delay table until a table is located that satisfies step 70.

At step 70 of FIG. 6, if a particular 2—2 delay table satisfies step 70, then step 84 is entered wherein the max load point is checked if it is equal to the maximum capacitance. If so, then process 500 terminates because it has reached the maximum end of the interpolation table. If not, then step 86 is entered where the min load point is set to the maximum load point and step 40 is entered (resetting the max load point to the maximum capacitance) so that another 2×2 delay table can be determined with new bounds. In this case, the max load point of the previous delay table becomes the min load point for the new delay table and, moreover, the maximum load point for the new delay table becomes the maximum capacitance value.

Process 500 continues as described above until a number of 2×2 delay tables are determined that have bounds inside of which only the prescribed error (e.g., 5% error) exists between their interpolated delay values and the actual delay values of the interpolation table of step 20. By creating these 2×2 delay tables and connecting them together into a single delay table, the present invention locates those sets of indices which are sufficient to represent the required delay information without consuming additional memory space. Therefore, the present invention is able to significantly reduce the memory size requirements for storing data substantially equivalent to the interpolation table of step 20.

At the completion of process 500 of FIG. 6, the present invention stores the 2×2 delay tables computed above into computer readable memory units of system 112 and associates these with the integrated circuit block as the optimum delay characterization for this integrated circuit block.

Example Results

Figure 7:
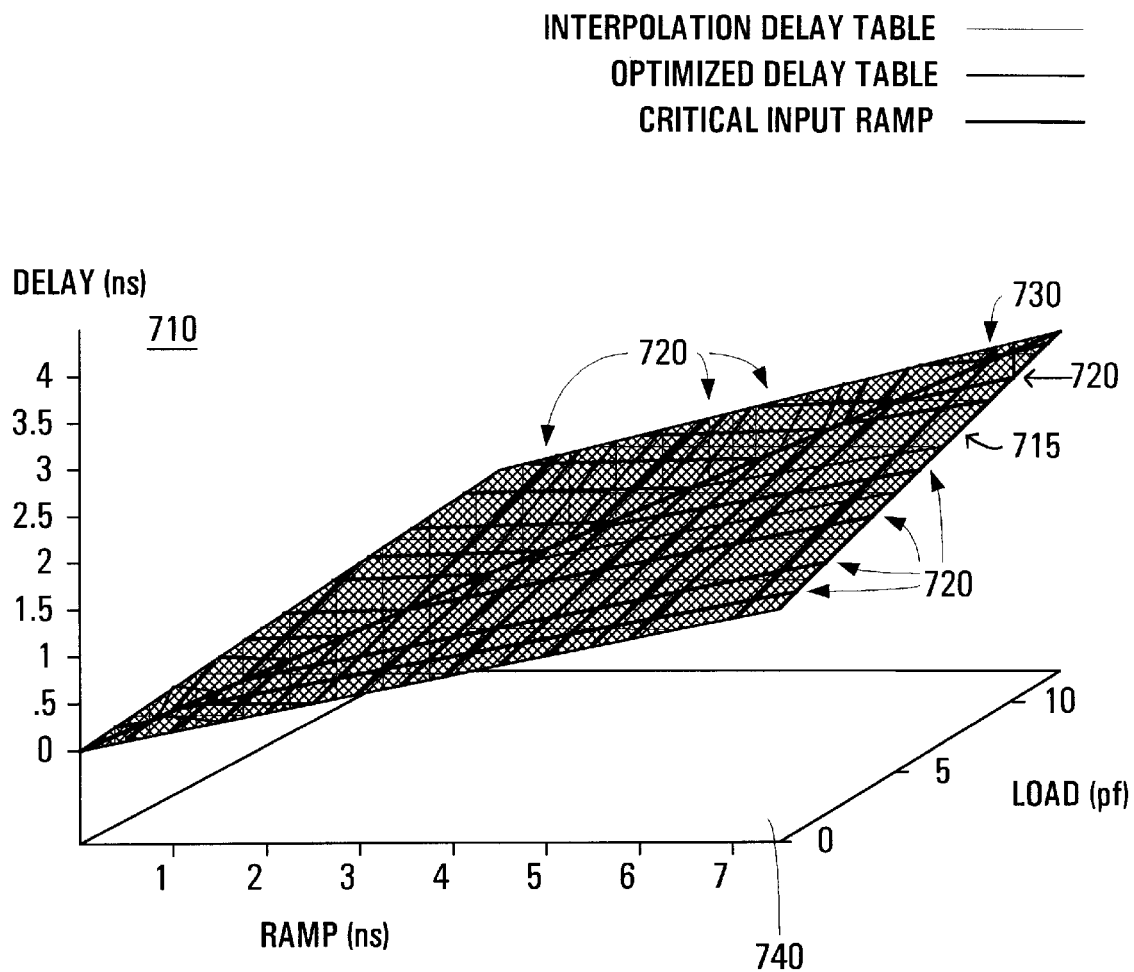
FIG. 7 illustrates a 10×10 delay table for an example timing rel resulting from the optimization process of the present invention.

FIG. 7 shows the 10×10 delay table 710 for the example timing relationship resulting from the optimization process in accordance with the present invention, illustrating the varying load/ramp indices as are sufficient to meet the error percentage limit. Also shown is the 64×64 non-linearly indexed base array 740 over which interpolation error analysis is to within 5% is performed. In FIG. 7, the closely spaced smaller grid lines 715 represent the interpolation delay table. The farther apart spaced grid lines 720 represent the optimized delay table as produced by the process 500 of the present invention. The diagonal line 730 spanning through the table represents the critical input ramp.

Figure 8:
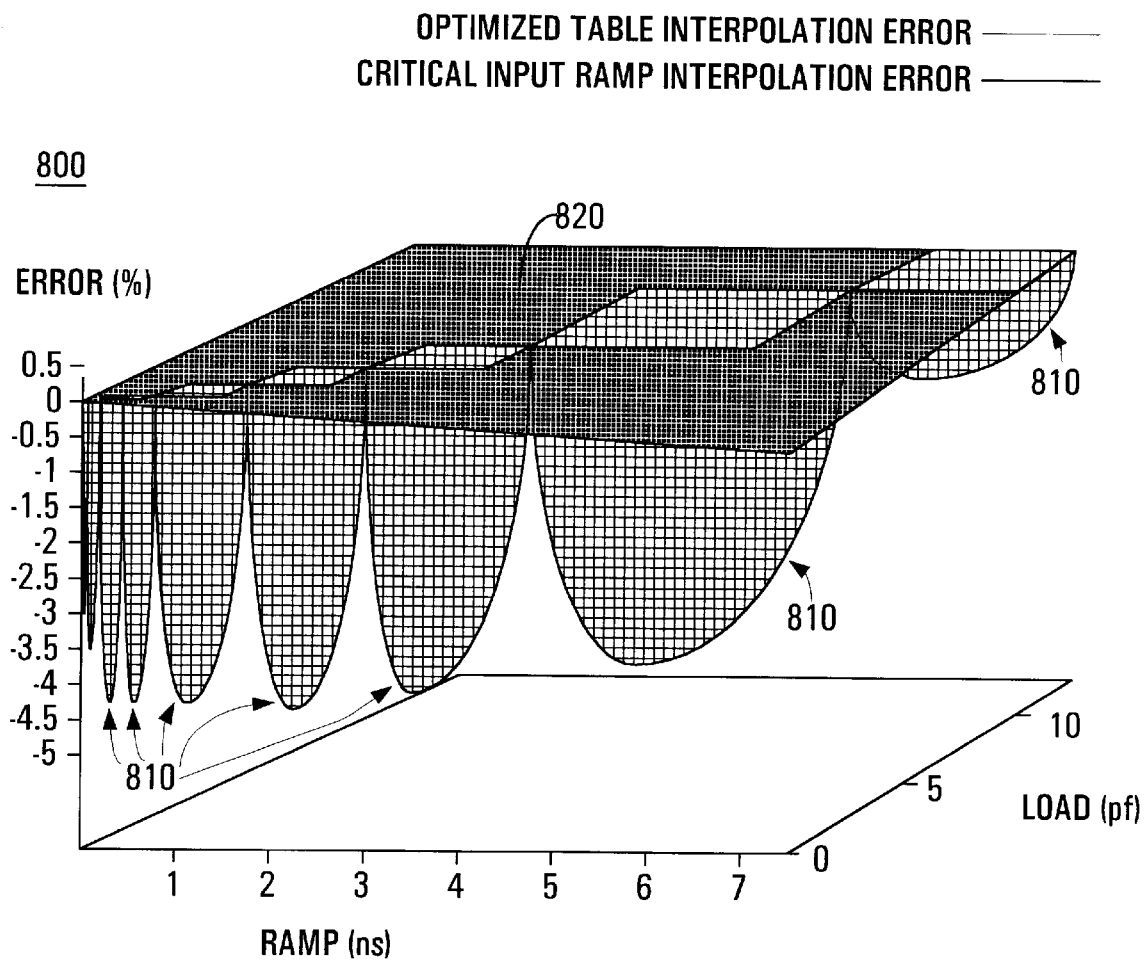
FIG. 8 illustrates the interpolation errors for an optimized delay table with respect to the base array.

FIG. 8 illustrates the interpolation errors 800 for the optimized delay table with respect to the base array, the maximum absolute value of which is 4.81%. Note the more or less equivalent interpolated delay error percentages throughout the table due to the individual optimization processing performed for each portion of the table. In FIG. 8, line 810 represents the critical input ramp interpolation error and grid lines 820 represent the optimized table interpolation error in the accordance with the present invention.

Methodology Comparison

Although the prior art delay table optimization methodology significantly reduced the size of generated tables, the present invention goes a step farther. Whereas the previous optimization resulted in a table size 18×18 for 324 points, the improved one results in a table size of 10×10 for 100 points, a significant reduction of over 74%.

Figure 9:
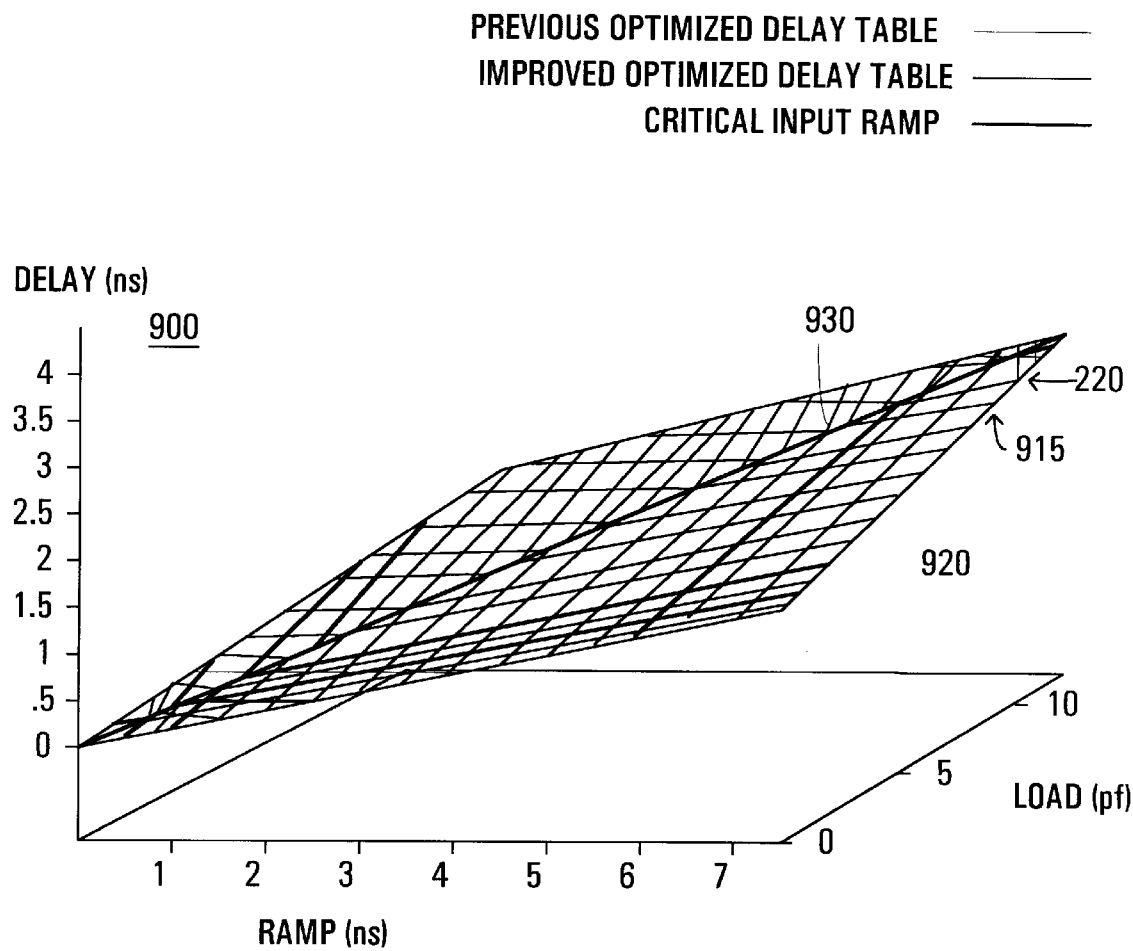
FIG. 9 illustrates a comparison of the delay tables generated by a prior art optimization method and the optimization method in accordance with the present invention.

FIG. 9 shows a comparison graph 900 of the delay tables generated by both the prior art optimization methodology and the present invention. With respect to FIG. 9, the closer spaced grid lines 915 represent the prior art optimized delay table while the farther spaced and darker grid lines 920 represent the optimized delay table in accordance with the present invention. Diagonal line 930 represents the critical input ramp.

Figure 10:
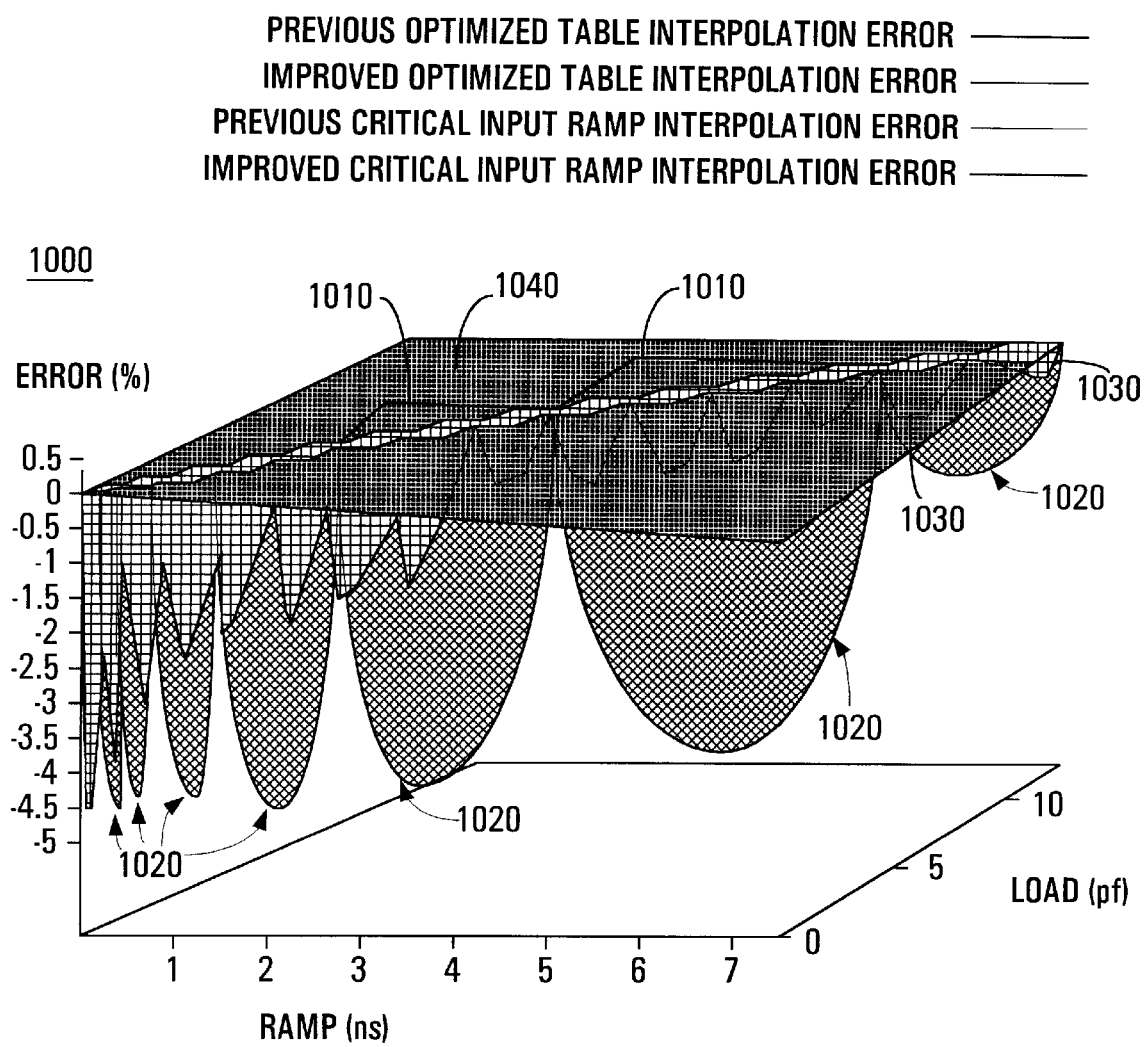
FIG. 10 illustrates a comparison of the interpolation errors attributed to the delay tables generated by a prior art optimization method and the optimization method in accordance with the present invention.

FIG. 10 shows the comparison graph 1000 of the interpolation errors for the delay tables generated by both the prior art and the present invention optimization processes. Note that, even though most of the error percentages of the improved optimization are much greater than those of the previous methodology, they are still within the specified error percentage limit of 5%. In FIG. 10, line 1020 represents the improved critical input ramp interpolation error in accordance with the present invention. Line 1030 represents the prior art critical input ramp interpolation error. Grid lines 1040 represent the optimization interpolation error in accordance with the present invention. Grid lines 1010 represent the optimization interpolation error of the prior art.

Complete Optimized Library Comparison

Both the prior art and present invention delay table optimization processes were applied against the entire 'vsc883' core library. This library consists of 529 cells containing a total of 512 single-state timing relationships for which delay table optimization is performed. A comparison of the resulting libraries is shown in Table 1 below. Note the significant overall reduction in the size of the optimized delay tables over the prior art optimization methodology.

The resulting libraries were then used by the Synopsys Design Compiler for the synthesis of a custom ALU Verilog design. The rough CPU compilation times shown in Table 1 were obtained under version 3.5a of the Synopsys Design Compiler on a SparcStation 10 running SunOS. The 12% improvement for this test case is indicative of smaller designs such as this. Larger design synthesis cases should obtain much better results.

TABLE 1

OPTIMIZATION RESULTS COMPARISON

|  | prior art methodology | of the present invention methodology | percentage improvement |
|---|---|---|---|
| max # indices (size) | 18 | 10 | 44 |
| max # points (area) | 324 | 100 | 74 |
| avg. size | 7 | 5 | 29 |
| avg. area | 76 | 40 | 47 |

TABLE 1-continued

OPTIMIZATION RESULTS COMPARISON

|  | prior art methodology | of the present invention methodology | percentage improvement |
|---|---|---|---|
| total area | 39392 | 20878 | 47 |
| compile time | 18:57 | 16:41 | 12 |

Conclusion

The prior art optimization methodology was an improvement over an earlier one. By choosing a delay table which only covers the full load range of a net, with appropriate sample points to cover corresponding critical input ramp points, accurate interpolated delay values are easily obtained. Furthermore, the reduction in the sample size of the table significantly reduces library resource usage. Lastly, by maintaining a non-linear distribution of sample points within the table, with the heaviest concentration of points within the most often interpolated region of the table (lower load regions for core nets, higher load regions for pad nets), additional significant delay value accuracy is attained.

The present invention optimization process described herein takes the prior art methodology farther. By optimizing those portions of the delay table sufficient to satisfy the error percentage limit requirement, a much smaller table can be obtained than when attempting to generate a single table at one time. Libraries generated in accordance with the present invention compile much faster than with the previous optimization methodology, resulting in less frustration and greater productivity for the designer.

The preferred embodiment of the present invention, improved input slope timing analysis process and non-linear delay table optimization process, is thus described. While the present invention has been described in particular embodiments, it should be appreciated that the present invention should not be construed as limited by such embodiments, but rather construed according to the below claims.

What is claimed is:

1. A method of determining a delay table for characterizing signal propagation delay of an integrated circuit block, said method comprising the steps of:

a) receiving an N×N interpolation table having N ramp input indices and N output capacitance indices and an actual delay value at each intersection of said indices, said interpolation table characterizing said signal propagation delay and receiving a maximum capacitance;

b) generating a first M×M delay table having M ramp input indices and M output capacitance indices which range from a minimum output capacitance to a maximum output capacitance said first M×M delay table enabling simulation of integrated circuit behavior for an integrated circuit represented as a netlist;

c) interpolating over bounds of said delay table to generate interpolated delay values;

d) comparing said interpolated delay values with corresponding actual delay values of said interpolation table;

e) reducing said maximum output capacitance range of said delay table and repeating steps c)–e) provided any of said interpolated delay values exceed a predetermined error percentage; and f) generating a second M×M delay table and repeating steps c)–e) on said second delay table provided said interpolated delay values of said first delay table do not exceed a predetermined error percentage said second M×M delay table enabling simulation of integrated circuit behavior for said integrated circuit represented as said netlist.

2. A method as described in claim 1 further comprising the step of combining said first and second delay tables for characterizing said signal propagation delay of said integrated circuit block.

3. A method as described in claim 1 wherein said second M×M delay table comprises M ramp input indices and M output capacitance indices which range from a minimum output capacitance to a maximum output capacitance and wherein said minimum output capacitance of said second delay table is said maximum output capacitance of said first delay table and wherein said maximum output capacitance of said second delay table is said maximum capacitance received by step a).

4. A method as described in claim 3 wherein said minimum output capacitance of said first delay table is zero and wherein said maximum output capacitance of said first delay table is said maximum capacitance received by step a).

5. A method as described in claim 3 wherein M is two and wherein N is greater than M.

6. A method as described in claim 1 wherein M is two and wherein N is greater than M.

7. A method as described in claim 1 wherein said predetermined error percentage is five percent.

8. A method of determining a delay table for characterizing signal propagation delay of an integrated circuit block, said method comprising the steps of:

a) receiving an N×N interpolation table having N ramp input indices and N output capacitance indices and an actual delay value at each intersection of said indices, said interpolation table characterizing said signal propagation delay and receiving a maximum capacitance;

b) generating a first M×M delay table having M ramp input indices and M output capacitance indices which range from a minimum output capacitance to a maximum output capacitance wherein N is greater than M;

c) interpolating over bounds of said delay table to generate interpolated delay values;

d) comparing said interpolated delay values with corresponding actual delay values of said interpolation table;

e) reducing said maximum output capacitance range of said delay table and repeating steps c)–e) provided any of said interpolated delay values exceed a predetermined error percentage;

f) generating a second M×M delay table and repeating steps c)–e) on said second delay table provided said interpolated delay values of said first delay table do not exceed a predetermined error percentage; and g) combining said first and second delay tables for characterizing said signal propagation delay of said integrated circuit block, said first and said second delay tables enabling simulation of integrated circuit behavior for an integrated circuit represented as a netlist.

9. A method as described in claim 8 wherein said second M×M delay table comprises M ramp input indices and M output capacitance indices which range from a minimum output capacitance to a maximum output capacitance and wherein said minimum output capacitance of said second delay table is said maximum output capacitance of said first delay table and wherein said maximum output capacitance of said second delay table is said maximum capacitance received at step a).

10. A method as described in claim 9 wherein said minimum output capacitance of said first delay table is zero and wherein said maximum output capacitance of said first delay table is said maximum capacitance received at step a).

11. A method as described in claim 10 wherein M is two.

12. A method as described in claim 10 wherein said predetermined error percentage is five percent.

13. A computer system having a processor coupled to a bus and a computer readable memory unit coupled to said bus, said memory unit having instructions stored thereon that when executed implement a method of determining a delay table for characterizing signal propagation delay of an integrated circuit block, said method comprising the steps of:

a) receiving an N×N interpolation table having N ramp input indices and N output capacitance indices and an actual delay value at each intersection of said indices, said interpolation table characterizing said signal propagation delay and receiving a maximum capacitance;

b) generating a first M×M delay table having M ramp input indices and M output capacitance indices which range from a minimum output capacitance to a maximum output capacitance said first M×M delay table enabling simulation of integrated circuit behavior for an integrated circuit represented as a netlist;

c) interpolating over bounds of said delay table to generate interpolated delay values;

d) comparing said interpolated delay values with corresponding actual delay values of said interpolation table;

e) reducing said maximum output capacitance range of said delay table and repeating steps c)–e) provided any of said interpolated delay values exceed a predetermined error percentage; and f) generating a second M×M delay table and repeating steps c)–e) on said second delay table provided said interpolated delay values of said first delay table do not exceed a predetermined error percentage, said second M×M delay table enabling simulation of integrated circuit behavior for said integrated circuit represented as said netlist.

14. A computer system as described in claim 13 wherein said method comprises the step of combining said first and second delay tables for characterizing said signal propagation delay of said integrated circuit block.

15. A computer system as described in claim 13 wherein said second M×M delay table comprises M ramp input indices and M output capacitance indices which range from a minimum output capacitance to a maximum output capacitance and wherein said minimum output capacitance of said second delay table is said maximum output capacitance of said first delay table and wherein said maximum output capacitance of said second delay table is said maximum capacitance received at step a).

16. A computer system as described in claim 15 wherein said minimum output capacitance of said first delay table is zero and wherein said maximum output capacitance of said first delay table is said maximum capacitance received at step a).

17. A computer system as described in claim 15 wherein M is two and wherein N is greater than M.

18. A computer system as described in claim 13 wherein M is two and wherein N is greater than M.

19. A computer system as described in claim 13 wherein said predetermined error percentage is five percent.

* * * * *